United States Patent
Soeno

(10) Patent No.: US 9,379,224 B2
(45) Date of Patent: Jun. 28, 2016

(54) SEMICONDUCTOR DEVICE

(75) Inventor: Akitaka Soeno, Toyota (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 0 days.

(21) Appl. No.: 14/240,883

(22) PCT Filed: Aug. 30, 2011

(86) PCT No.: PCT/JP2011/069542
§ 371 (c)(1),
(2), (4) Date: Feb. 25, 2014

(87) PCT Pub. No.: WO2013/030943
PCT Pub. Date: Mar. 7, 2013

(65) Prior Publication Data
US 2014/0217465 A1 Aug. 7, 2014

(51) Int. Cl.
| H01L 29/66 | (2006.01) |
| H01L 29/739 | (2006.01) |
| H01L 29/872 | (2006.01) |
| H01L 29/40 | (2006.01) |
| H01L 29/08 | (2006.01) |
| H01L 29/861 | (2006.01) |
| H01L 29/06 | (2006.01) |

(52) U.S. Cl.
CPC ........ *H01L 29/7393* (2013.01); *H01L 29/0834* (2013.01); *H01L 29/407* (2013.01); *H01L 29/7395* (2013.01); *H01L 29/7397* (2013.01); *H01L 29/8613* (2013.01); *H01L 29/8725* (2013.01); *H01L 29/0692* (2013.01); *H01L 29/0696* (2013.01)

(58) Field of Classification Search
CPC ..... H10L 27/02; H01L 27/04; H01L 29/7393; H01L 29/7395; H01L 29/8725
USPC .................. 257/140, 577, E27.009, E29.171
See application file for complete search history.

(56) References Cited

U.S. PATENT DOCUMENTS

| 6,054,748 | A | 4/2000 | Tsukuda et al. | |
| 7,436,022 | B2 * | 10/2008 | Bhalla et al. | 257/328 |
| 2007/0210386 | A1 * | 9/2007 | Mori | 257/359 |
| 2008/0048295 | A1 | 2/2008 | Takahashi | |
| 2009/0001411 | A1 * | 1/2009 | Tokura et al. | 257/140 |
| 2010/0090248 | A1 | 4/2010 | Kouno | |
| 2010/0156506 | A1 * | 6/2010 | Tsuzuki et al. | 327/478 |
| 2012/0007141 | A1 * | 1/2012 | Soeno | H01L 27/0664 257/140 |
| 2012/0132955 | A1 * | 5/2012 | Saito et al. | 257/140 |

FOREIGN PATENT DOCUMENTS

| EP | 2003694 A2 | 12/2008 | | |
| JP | 10-321877 A | 12/1998 | | |
| JP | 2008-505480 A | 2/2008 | | |
| JP | 2008-053648 A | 3/2008 | | |
| JP | 2009-535849 A | 10/2009 | | |
| JP | 2010-171385 A | 8/2010 | | |
| JP | 2010-263149 | * 11/2010 | ............. | H01L 27/04 |
| JP | 2010-263149 A | 11/2010 | | |
| JP | WO/2011/030454 | * 3/2011 | ............. | H01L 27/04 |
| WO | 2006/011882 A1 | 2/2006 | | |
| WO | 2007/133426 A2 | 11/2007 | | |

* cited by examiner

*Primary Examiner* — Jamie C Niesz
(74) *Attorney, Agent, or Firm* — Kenyon & Kenyon LLP

(57) ABSTRACT

A semiconductor device in which a diode region and an IGBT region are formed on a same semiconductor substrate is provided. The diode region includes a plurality of first conductivity type anode layers exposed to a surface of the semiconductor substrate and separated from each other. The IGBT region includes a plurality of first conductivity type body contact layers that are exposed to the surface of the semiconductor substrate and separated from each other. The anode layer includes at least one or more of the first anode layers. The first anode layer is formed in a position in the proximity of at least IGBT region, and an area of a plane direction of the semiconductor substrate in each of the first anode layers is larger than the area of a plane direction of the semiconductor substrate in the body contact layer in the closest proximity of the diode region.

1 Claim, 5 Drawing Sheets

US 9,379,224 B2

SEMICONDUCTOR DEVICE

CROSS-REFERENCE TO RELATED APPLICATIONS

This is a national phase application based on the PCT International Patent Application No. PCT/JP2011/069542 filed on Aug. 30, 2011, the entire contents of which are incorporated herein by reference.

TECHNICAL FIELD

The technique described herein relates to semiconductor devices.

BACKGROUND ART

Japanese Patent Application Publication No. 2008-53648 (Patent Document 1) discloses a semiconductor device in which a diode region and an IGBT region are formed on a same semiconductor substrate. In the diode region, an n-type cathode layer is formed on the back side of the semiconductor substrate, and in the IGBT region, a p-type collector layer is formed on a back side of the semiconductor substrate. The cathode layer and the collector layer come into contact with each other, and the boundary exists in a boundary region between the diode region and the IGBT region.

PRIOR ART DOCUMENT

Patent Document

Patent Document 1: Japanese Patent Application Publication No. 2008-53648 (JP 2008-53648 A)

SUMMARY OF THE INVENTION

Problem to be Solved by the Invention

In the semiconductor device in which the diode region and the IGBT region are formed on a same semiconductor substrate, forward voltage in the diode region is reduced by positive holes flowed from the IGBT region side into the diode region side during the operation of a diode. However, when the control for applying gate voltage is performed in the IGBT region during the operation of the diode, an n-type channel is formed from an emitter layer to a drift layer along an insulated gate in the IGBT region. When the channel is formed, positive holes flowed from the IGBT region side into the diode region side are reduced. As a result, the forward voltage in the diode region rises, and heat loss increases.

Means For Solving the Problem

The semiconductor device disclosed herein has a diode region and an IGBT region that are formed on a same semiconductor substrate. The diode region includes: a plurality of first conductivity type anode layers that are exposed to a surface of the semiconductor substrate and separated from each other; a first conductivity type diode body layer that is formed on a back side of the anode layer and has lower first conductivity type impurity concentration than the anode layer; a second conductivity type diode drift layer that is formed on the back side of the diode body layer; and a second conductivity type cathode layer that is formed on the back side of the diode drift layer and has higher second conductivity type impurity concentration than the diode drift layer. The IGBT region includes: a second conductivity type emitter layer that is exposed to the surface of the semiconductor substrate; a plurality of first conductivity type body contact layers that are exposed to the surface of the semiconductor substrate and separated from each other; a first conductivity type IGBT body layer that is formed on back sides of the emitter layer and a body contact layer and has lower first conductivity type impurity concentration than the body contact layer; a second conductivity type IGBT drift layer that is formed on the back side of the IGBT body layer; a first conductivity type collector layer that is formed on the back side of the IGBT drift layer; and an IGBT gate electrode that faces the IGBT body layer within a range separating the emitter layer from the IGBT drift layer with an insulation film therebetween. The anode layer includes at least one or more of the first anode layers. The first anode layer is formed in a position in the proximity of at least IGBT region, and an area of a plane direction of the semiconductor substrate in each of the first anode layers is larger than the area of a plane direction of the semiconductor substrate in the body contact layer in the closest proximity of the diode region.

According to the semiconductor device described above, the first anode layer is formed in a position in the proximity of at least IGBT region, and the area of a plane direction of the semiconductor substrate in each of the first anode layers is larger than the area of a plane direction of the semiconductor substrate in the body contact layer in the closest proximity of the diode region. Accordingly, during the operation of the diode, the amount of positive holes injected from the first anode layer into the diode drift layer increases more than the amount of positive holes injected from the body contact layer into the IGBT drift layer. The amount of the positive holes flowed from the IGBT region can be relatively less than the amount of the positive holes injected from the anode layer in the proximity of the IGBT region, and thus fluctuations in the forward voltage in the diode region due to the amount of positive holes flowed from the IGBT region can be prevented. Because the amount of the positive hole flowed from the IGBT region is reduced, a rise in the forward voltage in the diode region and an increase in heat loss can be prevented.

The semiconductor device described above may further include at least one or more of second anode layers that are formed in a position farther from the IGBT region than the first anode layer. The area of a plane direction of the semiconductor substrate in each of the second anode layers may be smaller than the area of a plane direction of the semiconductor substrate in each of the first anode layers. In addition, the area of a plane direction of the semiconductor substrate in each of the second anode layers may be larger than the area of a plane direction of the semiconductor substrate in the body contact layer in the closest proximity of the diode region.

MODES FOR CARRYING OUT THE INVENTION

Figure 1:
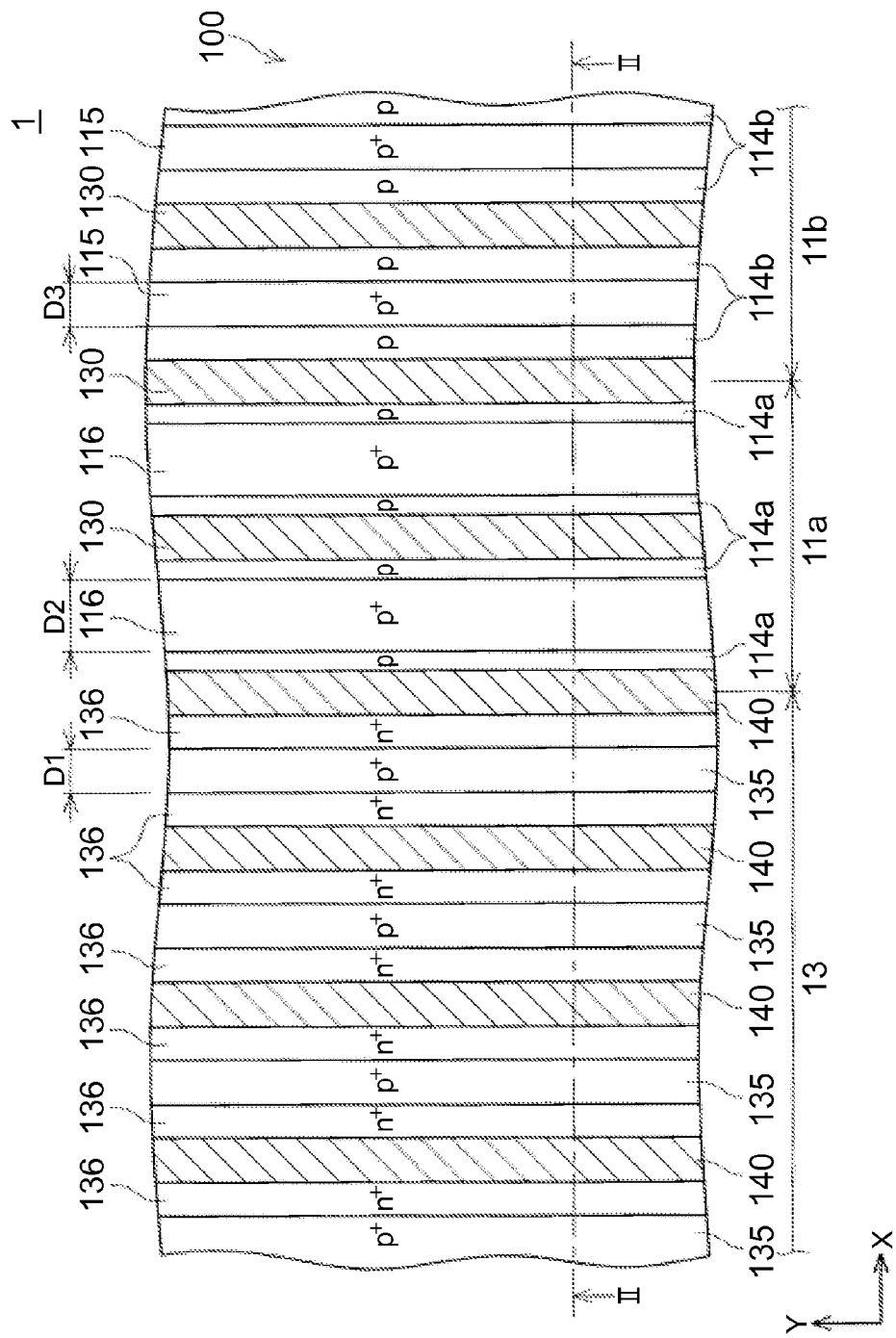
FIG. 1 is a plan view of the semiconductor device according to Embodiment 1.

In the semiconductor device disclosed herein, the anode layer includes at least one or more of first anode layers. The first anode layer is formed in a position in the proximity of at least IGBT region. The area of a plane direction of the semiconductor substrate in each of the first anode layers is larger than the area of a plane direction of the semiconductor substrate in the body contact layer in the closest proximity of the diode region. It should be noted that the term "in the closest proximity of the diode region" means in which it is formed in an end of the IGBT region and the distance to boundary between the IGBT region and the diode region is the closest. In addition, the anode layer formed in "a position in the proximity of the IGBT region" means one or more anode layers formed in a nearer position from the boundary between the IGBT region and the diode region. The anode layer formed in "a position in the proximity of the IGBT region" includes the anode layer in the closest proximity of the IGBT region, and may further include one or more anode layers that are formed in the position farther from the IGBT region than the anode layer described above. Thus, for example, the first anode layers may be located in about the first to third positions from the side close to the boundary between the IGBT region and the diode region.

For example, although not particularly limited, when both the anode layer and the body contact layer are formed to uniformly extend along the longitudinal direction of the insulated gate, the widths of the insulated gates in the first anode layers in a short direction (a direction normal to the longitudinal direction) is made to be larger than the width in the short direction of the insulated gate of the body contact layer in the closest proximity of the diode region. Accordingly, the area of a plane direction of the semiconductor substrate in each of the first anode layers can be formed larger than the area of a plane direction of the semiconductor substrate in the body contact layer in the closest proximity of the diode region.

The semiconductor device described above may include at least one or more of second anode layers that are formed in a position farther from the IGBT region than the first anode layer. For example, among the plurality of anode layers, the first anode layer may be formed in about the first to third position from the side close to the boundary between the IGBT region and the diode region, and the second anode layer may be formed in a position farther from the IGBT region than the first anode layer. The area of a plane direction of the semiconductor substrate in each of the second anode layers may be larger than, approximately the same as, or smaller than the area of a plane direction of the semiconductor substrate in the body contact layer in the closest proximity of the diode region. For example, the area of a plane direction of the semiconductor substrate in the anode layer may gradually reduce from the side of the first anode layer to the side of the second anode layer (that is, from the near side to the far side of the IGBT region). When the area of a plane direction of the semiconductor substrate in the anode layer is changed in accordance with the distance from the IGBT region, for example, the area of a plane direction of the semiconductor substrate in the second anode layer is preferably reduced to compensate the increase in the area of a plane direction of the semiconductor substrate in the first anode layer. The injection amount of the positive holes in the entire diode region can be reduced to the same level as or less than that of the semiconductor device with the conventional structure, and therefore the amount of the structure for controlling the lifetime of carriers that are formed in the diode region (for example, crystal defect) can be reduced, for example. In addition, the area of a plane direction of the semiconductor substrate in each of the first anode layers and the second anode layers may be larger than the area of a plane direction of the semiconductor substrate in the body contact layer in the closest proximity of the diode region. In other words, in all of the plurality of anode layers, the area of a plane direction of the semiconductor substrate in each of the anode layers may be larger than the area of a plane direction of the semiconductor substrate in the body contact layer in the closest proximity of the diode region. In addition, the area of a plane direction of the semiconductor substrate in each of the plurality of anode layers may approximately be the same. In other words, the area of a plane direction of the semiconductor substrate in each of the plurality of anode layers may be the same as the area of a plane direction of the semiconductor substrate in each of the first anode layers.

The diode region and the IGBT region may exist one for each, or the plurality of diode regions and the plurality of IGBT regions may exist. For example, when the plurality of diode regions exists in one IGBT region or the plurality of IGBT regions are alternately arranged, the semiconductor device has the plurality of boundaries between the diode region and the IGBT region. In the semiconductor device that has the plurality of boundaries between the diode region and the IGBT region, the influence on the characteristics of the semiconductor device increases due to the movement of the carrier between the diode region and the IGBT region. Thus, the effect of improving the semiconductor characteristics can significantly be achieved by the structure according to the present application in which the area of a plane direction of the semiconductor substrate in the first anode layer is larger than the area of a plane direction of the semiconductor substrate in the body contact layer in the closest proximity of the diode region. In the semiconductor device that has the plurality of boundaries between the diode region and the IGBT region, the structure of the anode layer according to the present application described above may be applied in the proximity of at least one boundary between the diode region and the IGBT region.

The semiconductor device according to the present application may include a buffer layer in contact with the back side of the drift layer, and the collector layer and the cathode layer may be formed in contact with the back side of the buffer layer. In addition, an insulated gate or a dummy gate may be formed in the diode region.

The semiconductor device disclosed in the present application can easily be fabricated by using conventional production methods of the semiconductor devices. For example, in the process of implanting impurities in order to form the anode layer, the body contact layer, and the like, it can easily be fabricated by adjusting the shapes of pattern masks.

Embodiment 1

(Semiconductor Device)

Figure 2:
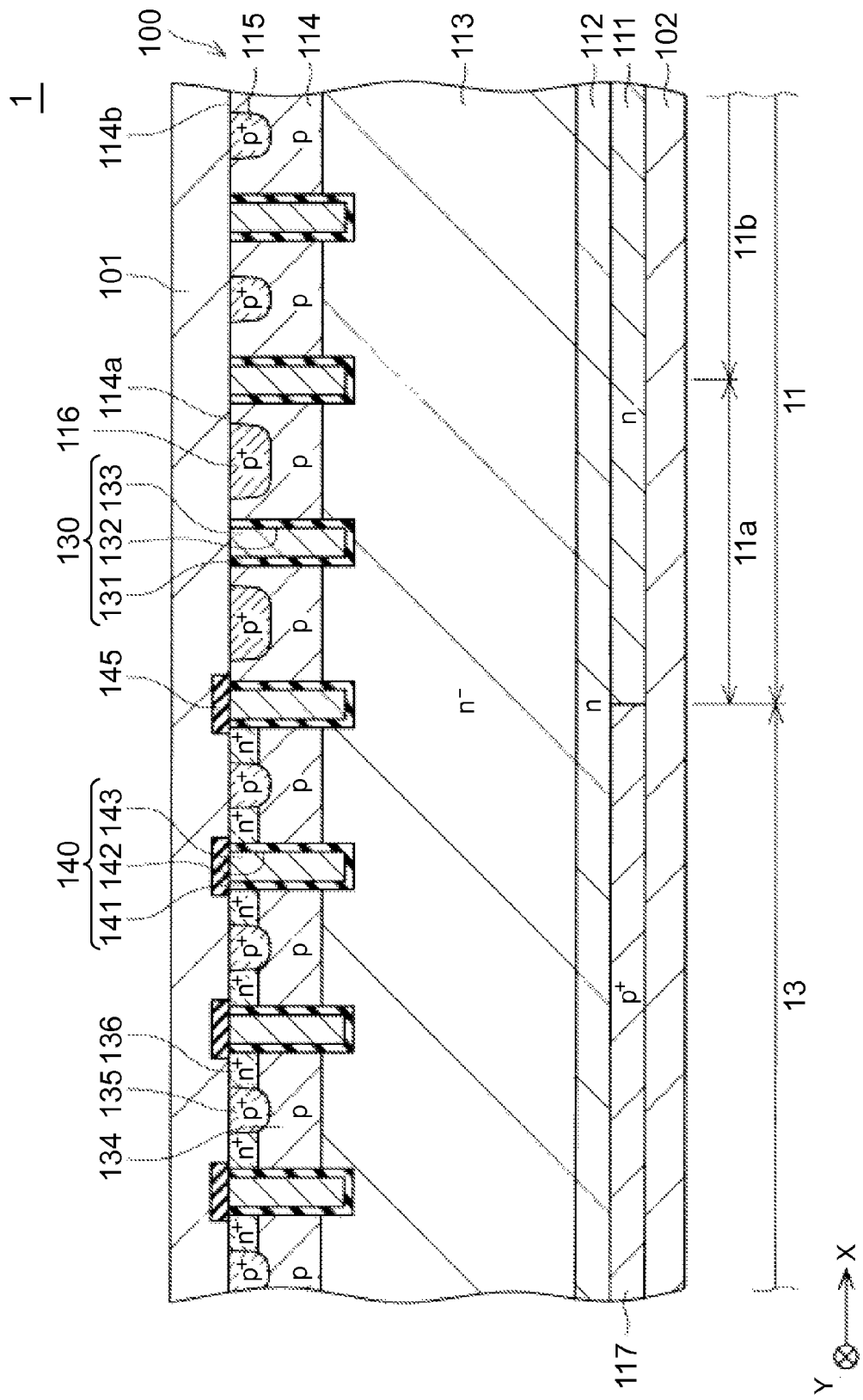
FIG. 2 is a cross-sectional view taken along the line II-II in FIG. 1.

The semiconductor device shown in FIGS. 1 and 2 is an RC-IGBT in which an IGBT and a diode are formed on the same semiconductor substrate 100. It should be noted that the plan view shown in FIG. 1 omits the representation of a surface electrode 101 formed on the surface of the semiconductor substrate 100 and illustrates the surface of the semiconductor substrate 100. In addition, the semiconductor device 1 has a plurality of IGBT regions and a plurality of diode regions that are alternately disposed and a plurality of boundaries between the IGBT regions and the diode regions. FIGS. 1 and 2 show one of the boundaries between the plurality of IGBT regions and diode regions, and the plurality of boundaries in the semiconductor device 1 each have the same structures as those in FIGS. 1 and 2.

The semiconductor device 1 includes the semiconductor substrate 100, a dummy gate 130 that is formed on the front side of the semiconductor substrate 100, an insulated gate 140 and a surface insulation film 145, the surface electrode 101 that comes into contact with the surface of the semiconductor substrate 100, and a backside electrode 102 that comes into contact with the back side of the semiconductor substrate 100. The semiconductor substrate 100 includes a diode region 11 and an IGBT region 13. The diode region 11 includes a first diode region 11a and a second diode region 11b. The first diode region 11a is located in the proximity of the IGBT region 13 and formed between the second diode region 11b and the IGBT region 13. The dummy gate 130 and the insulated gate 140 are formed in the semiconductor substrate 100 at approximately regular interval.

The semiconductor substrate 100 includes a p+-type body contact layer 135, an n+-type emitter layer 136, p+-type first anode layer 116 and second anode layer 115, a p-type diode body layer 114, a p-type IGBT body layer 134, an n-type drift layer 113, an n-type buffer layer 112, an n+-type cathode layer 111, and a p+-type collector layer 117. The body contact layer 135, the emitter layer 136, the first anode layer 116, and the second anode layer 115 are exposed to the surface of the semiconductor substrate 100. The diode body layers 114 are formed on the back side and the lateral side of the first anode layer 116 and the second anode layer 115. The IGBT body layer 134 is formed on the back sides of the body contact layer 135 and the emitter layer 136. The drift layer 113 is formed on the back sides of the diode body layer 114 and the IGBT body layer 134. The buffer layer 112 is formed on the back side of the drift layer 113. The cathode layer 111 and the collector layer 117 are formed on the back side of the buffer layer 112. The first anode layer 116 and the second anode layer 115 have higher p-type impurity concentration than the diode body layer 114. The body contact layer 135 and the collector layer 117 have higher p-type impurity concentration than the IGBT body layer 134. In the semiconductor device 1, the diode body layer 114 and the IGBT body layer 134 have the same p-type impurity concentration. The emitter layer 136 and the cathode layer 111 have higher p-type impurity concentration than the drift layer 113 and the buffer layer 112, and the buffer layer 112 has higher p-type impurity concentration than the drift layer 113. In the semiconductor device 1, a diode drift layer and an IGBT drift layer are formed as one layer (drift layer 113). Of the drift layer 113, a part that is included in the diode region 11 is the diode drift layer, and a part that is included in the IGBT region 13 is the IGBT drift layer.

As shown in FIG. 1, in the first diode region 11a, the first anode layer 116 and a surface part 114a (a part of the diode body layer 114 and that is exposed to the surface of the semiconductor substrate 100) are exposed to the surface of the semiconductor substrate 100, and each of those comes into contact with the surface electrode 101. In the second diode region 11b, the second anode layer 115 and a surface part 114b (a part of the diode body layer 114 and that is exposed to the surface of the semiconductor substrate 100) are exposed to the surface of the semiconductor substrate 100, and each of those comes into contact with the surface electrode 101. In the diode region 11, the cathode layer 111 is exposed to the back side of the semiconductor substrate 100 and comes into contact with the backside electrode 102.

In addition, in the IGBT region 13, the body contact layer 135 and the emitter layer 136 are exposed to the surface of the semiconductor substrate 100 and comes into contact with the surface electrode 101. In the IGBT region 13, the collector layer 117 is exposed to the back side of the semiconductor substrate 100 and comes into contact with the backside electrode 102.

In the diode region 11, the dummy gate 130 is formed that passes through the diode body layer 114 from the front side of the semiconductor substrate 100 and reaches the drift layer 113. The dummy gate 130 includes a dummy gate insulation film 132 that is formed in an inner wall of a trench 131 which is formed on the front side of the semiconductor substrate 100 and a dummy gate electrode 133 that is covered with the dummy gate insulation film 132 and filled in the trench 131. The dummy gate 130 comes into contact with the diode body layer 114. The dummy gate electrode 133 is electrically connected to the surface electrode 101.

In the IGBT region 13, the insulated gate 140 is formed that passes through the IGBT body layer 134 from the front side of the semiconductor substrate 100 and reaches the drift layer 113. The insulated gate 140 includes a gate insulation film 142 that is formed in the inner wall of a trench 141 which is formed on the front side of the semiconductor substrate 100 and a gate electrode 143 that is covered with the gate insulation film 142 and filled in the trench 141. The insulated gate 140 comes into contact with the IGBT body layer 134 that is a part separating the emitter layer 136 from the drift layer 113. The gate electrode 143 is separated from the surface electrode 101 by the surface insulation film 145.

As shown in FIG. 1, the first anode layer 116, the second anode layer 115, the body contact layer 135, and the emitter layer 136 extend along the longitudinal direction of the dummy gate 130 or the insulated gate 140 (y-direction shown in FIG. 1), and widths of the dummy gate 130 and the insulated gate 140 in the short direction (x-direction shown in FIG. 1) are approximately uniform along the longitudinal direction of the dummy gate 130 or the insulated gate 140. The anode layers in two rows that are positioned at an end of the diode region 11 and in the proximity of the IGBT region 13 are the first anode layer 116. The anode layer that is positioned at a center side of the diode region 11 and formed in the position farther from the IGBT region than the first anode layer 116 is the second anode layer 115. A width D1 of the second anode layer 115 in the x-direction is approximately the same as a width D3 of the body contact layer 135 in the x-direction, and a width D2 of the first anode layer 116 in the x-direction is larger than the width D1 and the width D3. The first anode layer 116, the second anode layer 115, and the body contact layer 135 extend along the y-direction, and thus as the width in the x-direction is larger, the area of a plane direction of the semiconductor substrate becomes greater. In other words, the area of a plane direction of the semiconductor substrate in the first anode layer 116 is larger than the area of a plane direction of the semiconductor substrate in the second anode layer 115 or the body contact layer 135. The width of the surface part 114a in the x-direction is smaller than the width of the surface part 114b in the x-direction. The width of the emitter layer 136 in the x-direction is approximately the same as the width of the surface part 114b in the x-direction.

The operation of semiconductor device 1 is described next.

<During Operation of IGBT>

When electric potential Va of the backside electrode 102 is set higher than electric potential Vb of the surface electrode 101 (Va>Vb) and positive voltage (positive bias) is applied to the gate electrodes 133, 143, a channel is formed in the vicinity of the insulated gate 140 in the IGBT body layer 134. An electron that is a majority carrier is injected from the emitter layer 136 into the drift layer 113 through the channel. In addition, a positive hole is injected from the collector layer 117 into the drift layer 113. When the positive hole that is a minority carrier is injected into the drift layer 113, conductivity modulation occurs in the drift layer 113, and the resistance in the drift layer 113 decreases. As a result of the movement of the electron and the positive hole, IGBT current flows from the back side (the side of the collector layer 117) to the front side (the side of the emitter layer 136) of the semiconductor substrate 100.

<During Operation of Diode>

Figure 3:
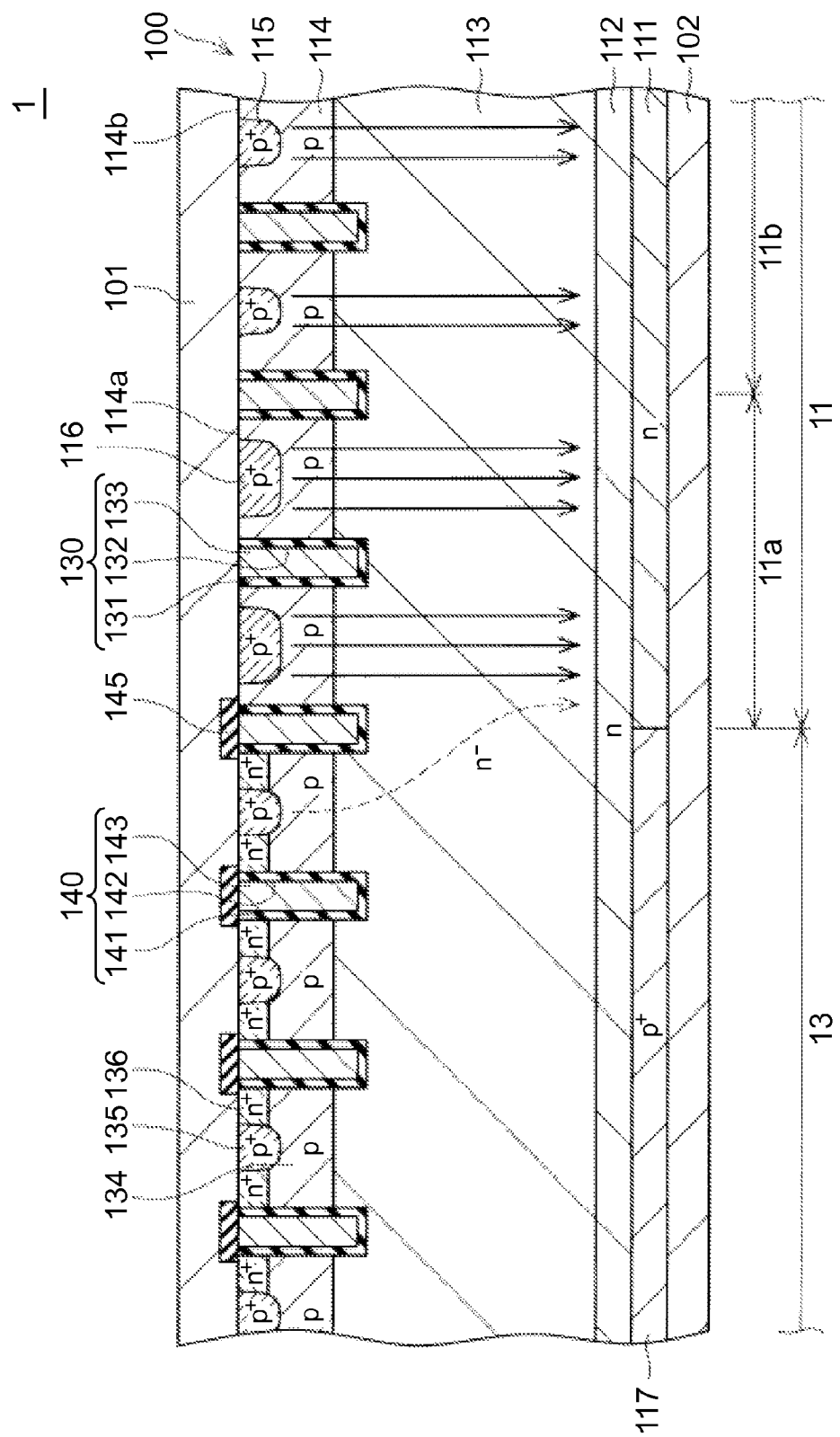
FIG. 3 is a diagram that illustrates a state of the semiconductor device according to the Embodiment 1 during the operation of a diode.

Next, when the electric potential Va of the backside electrode 102 is set lower than the electric potential Vb of the surface electrode 101 (Va<Vb), as shown with solid lines in FIG. 3, in the diode region 11, the positive hole is injected from the first anode layer 116 and the second anode layer 115, through the diode body layer 114, into the drift layer 113. Consequently, diode current (reflux current) flows from the side of the first anode layer 116 and the second anode layer 115 to the side of the cathode layer 111. At this time, also in the IGBT region 13 adjacent to the diode region 11, as shown with a broken line in FIG. 3, the positive hole is injected from the body contact layer 135, through the diode body layer 114, into the drift layer 113. The positive hole injected from the body contact layer moves toward the cathode layer 111 in the diode region 11. Forward voltage in the diode region 11 is reduced by the positive hole injected from the body contact layer.

When the positive voltage is applied to the gate electrode 133 during the operation of the diode, an n-type channel is formed in the vicinity of the insulated gate 140 in the IGBT body layer 134 of the IGBT region 13. By the electron injected into the drift layer 113 through the n-type channel, the positive hole injected from the body contact layer is compensated. As a result, the amount of positive holes that are injected from the body contact layer and move toward the cathode layer 111 in the diode region 11 decreases.

In this embodiment, the area of a plane direction of the semiconductor substrate in the first anode layer 116 in two rows adjacent to the IGBT region 13 is larger than the area of a plane direction of the semiconductor substrate in the second anode layer 115 or the body contact layer 135. Accordingly, in the first diode region 11a, the amount of positive holes injected from the first anode layer 116 into the drift layer 113 increases, and the positive holes injected from the body contact layer 135 as shown with the broken line in FIG. 3 can be relatively less than the positive holes injected from the first anode layer 116 and the second anode layer 115 as shown with solid lines in FIG. 3. Furthermore, a number of positive holes are injected from the first anode layer 116, and thus the forward voltage in the diode region 11 can be reduced. Because the positive hole injected from the body contact layer 135 can be reduced, a rise in the forward voltage in the diode region and an increase in heat loss can be prevented.

Modification Example

Figure 4:
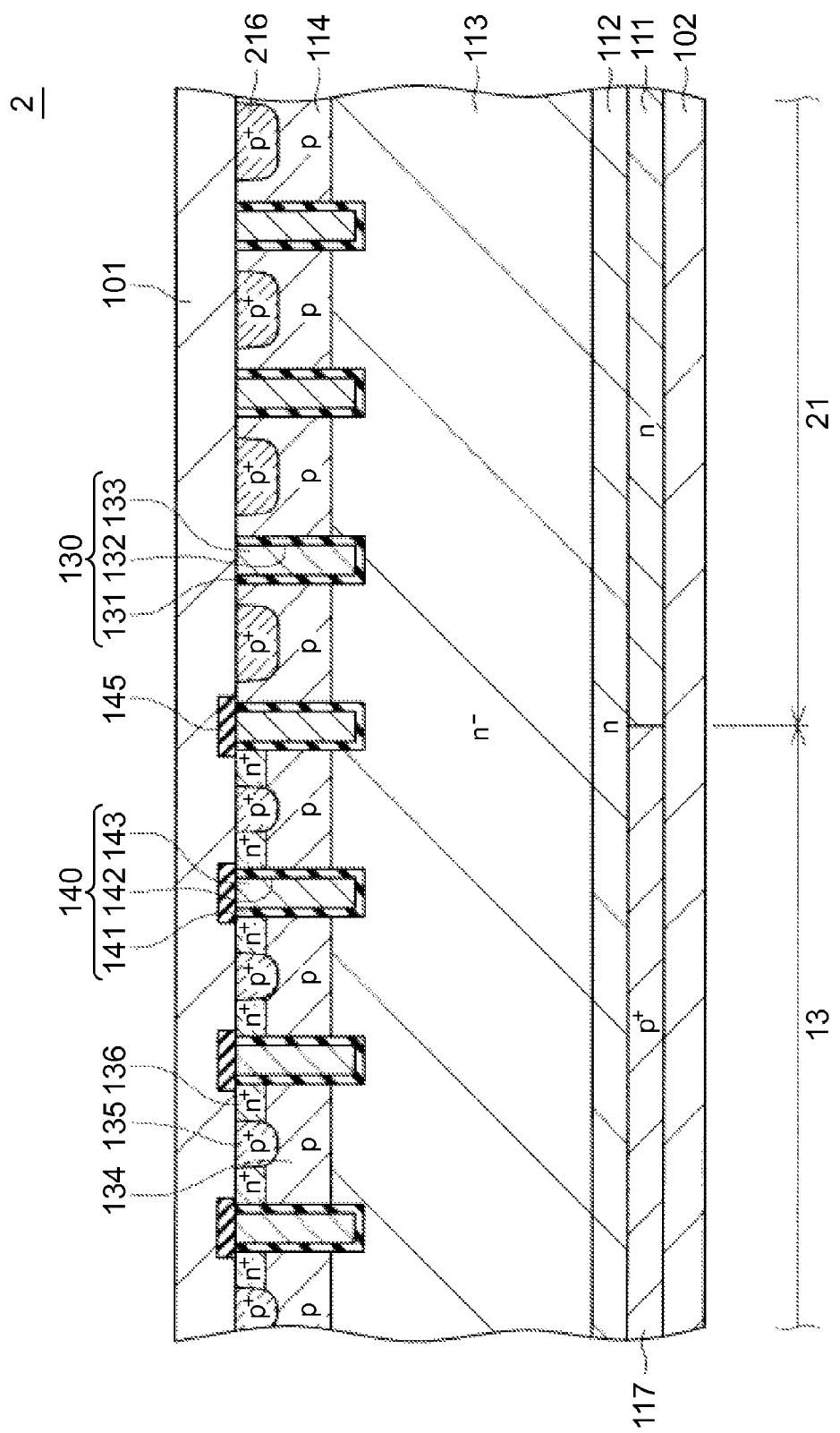
FIG. 4 is a plan view of the semiconductor device according to a modification example.

In the above embodiment, a case where only the first anode layer positioned in the proximity of the IGBT region in the diode region has large width has been exemplified and described; however, the present invention is not limited to this. For example, in the entire diode region, the width of the anode layer may be larger than that of the body contact layer. In other words, like a semiconductor device 2 shown in FIG. 4, a diode region 21 in which an anode layer 216 that has the same width D2 as the first anode layer 116 shown in FIG. 1 is entirely formed may be included. Similarly to FIG. 1, the width D2 of the anode layer 216 in the x-direction is larger than the width D1 of the body contact layer 135, and the area of a plane direction of the semiconductor substrate in the anode layer 216 is larger than the area of a plane direction of the semiconductor substrate in the body contact layer 135. Other structures are the same as those of the semiconductor device 1 shown in FIG. 1, and thus redundant descriptions are not repeated. In the entire diode region 21, the area of a plane direction of the semiconductor substrate in the anode layer 216 is larger than the area of a plane direction of the semiconductor substrate in the body contact layer 135, and thus the influence of the positive hole that moves from the body contact layer 135 to the side of the diode region 21 can be reduced further. Consequently, the effects of reducing the degree of the rise in the forward voltage and the heat loss due to the positive hole injected from the body contact layer 135 can be achieved more dominantly.

Figure 5:
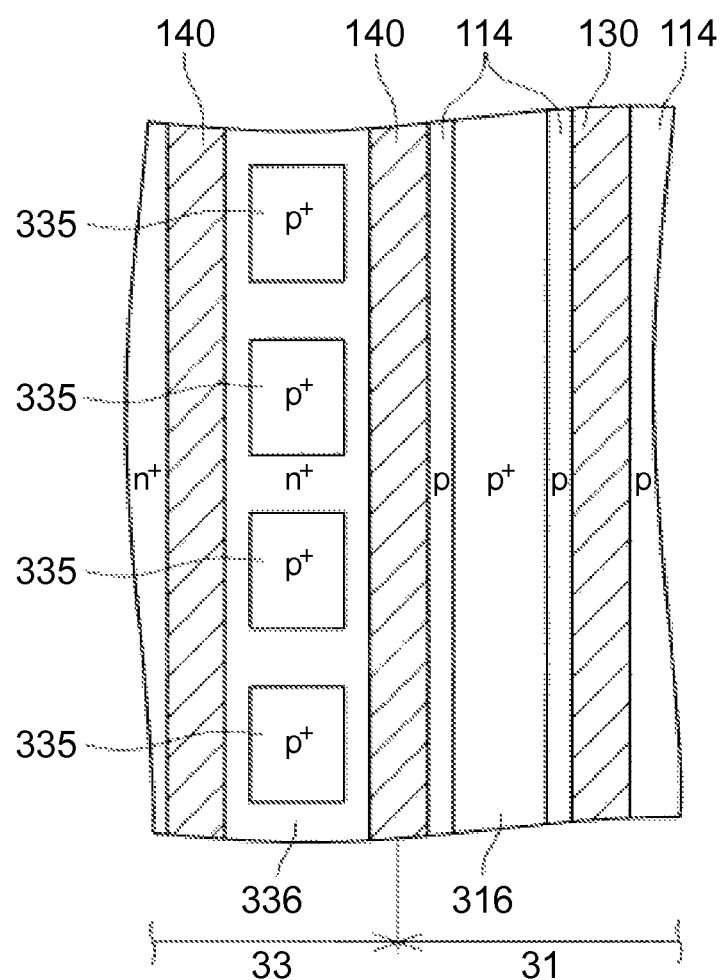
FIG. 5 is a plan view of the semiconductor device according to the modification example.

Additionally, in the above embodiment, a case where the anode layer, the body contact layer, and the emitter layer extend along the longitudinal direction of the insulated gate and the width of the insulated gate in the short direction is approximately uniform has been exemplified and described; however, the shapes of the anode layer, the body contact layer, and the emitter layer are not limited to these. When the area of a plane direction of the semiconductor substrate in the anode layer in the proximity of the IGBT region can be made larger than the area of a plane direction of the semiconductor substrate in the body contact layer in the closest proximity of the diode region, the shapes of the anode layer, the body contact layer, and the emitter layer are not particularly limited. For example, as shown in FIG. 5, in the IGBT region 33, a ladder-shaped emitter layer 336 may be formed between the insulated gates 140, and body contact layers 335 may be formed in the ladder shape of the emitter layer 336. In the diode region 31, a first anode layer 316 in the proximity of the IGBT region 33 extends, similarly to FIG. 1, along the longitudinal direction of the dummy gate 130. The area of a plane direction of the semiconductor substrate in the first anode layer 316 is larger than the sum of the areas of a plane direction of the semiconductor substrate in the body contact layers 335 formed between the adjacent insulated gates 140. Other structures are the same as those of the semiconductor device 1 shown in FIG. 1, and thus redundant descriptions are not repeated.

While the present invention has been described in detail with reference to example embodiments thereof, it is to be understood that those examples are merely illustrative and claims of the present invention are not limited to those examples. The techniques that are disclosed in the claims of the present invention are intended to cover various modifications and changes of the example embodiments that are described above.

In addition, the technical elements that are disclosed in the specification and the drawings exhibit technical usefulness alone or in various combinations and configurations, and those are not limited to the combinations and configurations that are disclosed in the claims at the time of filing this application. The techniques that are illustrated in the specification and the drawings can achieve a plurality of objects simultaneously, and the achievement of one object thereof itself has technical usefulness.

The invention claimed is:

1. A semiconductor device, comprising:
a diode region that includes:
a plurality of first conductivity type anode layers having a surface that is exposed to a surface of a semiconductor substrate and separated from each other;
a first conductivity type diode body layer that is formed on a back side of the plurality of anode layers and has lower first conductivity type impurity concentration than the plurality of anode layers;
a second conductivity type diode drift layer that is formed on the back side of the diode body layer; and a second conductivity type cathode layer that is formed on the back side of the diode drift layer and has higher second conductivity type impurity concentration than the diode drift layer, and an IGBT region that is formed on a same semiconductor substrate as the diode region, the IGBT region includes:

a second conductivity type emitter layer that is exposed to the surface of the semiconductor substrate;

a plurality of first conductivity type body contact layers that are exposed to the surface of the semiconductor substrate and separated from each other;

a first conductivity type IGBT body layer that is formed on back sides of the emitter layer and the plurality of body contact layers and has lower first conductivity type impurity concentration than the plurality of body contact layers;

a second conductivity type IGBT drift layer that is formed on the back side of the IGBT body layer;

a first conductivity type collector layer that is formed on the back side of the IGBT drift layer; and an IGBT gate electrode that faces the IGBT body layer within a range separating the emitter layer from the IGBT drift layer with an insulation film therebetween, wherein the plurality of anode layers includes a plurality of first anode layers, the plurality of first anode layers are formed in a position in the proximity of at least the IGBT region, an area of a plane direction of the semiconductor substrate in each of the first anode layers is larger than the area of a plane direction of the semiconductor substrate in the plurality of body contact layers in the closest proximity of the diode region, the plurality of anode layers further includes a plurality of second anode layers that are formed in a position farther from the IGBT region than the plurality of first anode layers, and the area of a plane direction of the semiconductor substrate in each of the second anode layers is smaller than the area of the plane direction of the semiconductor substrate in each of the first anode layers, the semiconductor device, further comprising:

an area that comes into contact with a surface electrode of a plane direction of the semiconductor substrate in each of the first anode layers is larger than the area that comes into contact with the surface electrode of a plane direction of the semiconductor substrate in the body contact layer in the closest proximity of the diode region, the surface electrode comes into contact with the surface of the semiconductor substrate, wherein the area that comes into contact with the surface electrode of a plane direction of the semiconductor substrate in each of the second anode layers is smaller than the area that comes into contact with the surface electrode of the plane direction of the semiconductor substrate in each of the first anode layers, wherein all surfaces of the plurality of anode layers, except a surface of the plurality of anode layers that is exposed to the surface of the semiconductor substrate, are in contact with the diode body layer.

* * * * *